US 12,125,626 B2

(12) United States Patent
Kawai

(10) Patent No.: US 12,125,626 B2
(45) Date of Patent: Oct. 22, 2024

(54) INDUCTOR BUILT-IN SUBSTRATE

(71) Applicant: IBIDEN CO., LTD., Gifu (JP)

(72) Inventor: Satoru Kawai, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 544 days.

(21) Appl. No.: 17/106,225

(22) Filed: Nov. 30, 2020

(65) Prior Publication Data

US 2021/0183562 A1 Jun. 17, 2021

(30) Foreign Application Priority Data

Dec. 17, 2019 (JP) ................. 2019-227175

(51) Int. Cl.
| | | |
|---|---|---|
| H01F 27/28 | (2006.01) | |
| H01F 27/25 | (2006.01) | |
| H01F 41/04 | (2006.01) | |
| H01F 41/24 | (2006.01) | |
| H01L 21/48 | (2006.01) | |
| H01L 23/49 | (2006.01) | |
| H01L 23/498 | (2006.01) | |
| H01L 23/64 | (2006.01) | |
| H01F 27/255 | (2006.01) | |

(52) U.S. Cl.
CPC ....... *H01F 27/2804* (2013.01); *H01F 41/041* (2013.01); *H01F 41/24* (2013.01); *H01L 21/486* (2013.01); *H01L 21/4864* (2013.01); *H01L 23/49827* (2013.01); *H01L 23/645* (2013.01); *H01F 27/255* (2013.01); *H01F 2027/2809* (2013.01)

(58) Field of Classification Search
CPC .... H01F 27/2804; H01F 41/041; H01F 41/24; H01F 27/255; H01F 2027/2809; H01F 1/26; H01F 17/0006; H01F 2017/002; H01F 2017/065; H01F 17/06; H01L 21/486; H01L 21/4864; H01L 23/49827; H01L 23/645

See application file for complete search history.

(56) References Cited

U.S. PATENT DOCUMENTS

| | | | | |
|---|---|---|---|---|
| 9,837,208 | B2* | 12/2017 | Nakao | ..... H01F 17/04 |
| 11,189,409 | B2* | 11/2021 | Brown | ..... H05K 1/181 |
| 2007/0257761 | A1* | 11/2007 | Mano | ..... H01F 17/0006 336/200 |
| 2013/0223033 | A1* | 8/2013 | Mano | ..... H01F 27/2804 336/200 |

(Continued)

FOREIGN PATENT DOCUMENTS

JP 2016-197624 A 11/2016

*Primary Examiner* — Malcolm Barnes
(74) *Attorney, Agent, or Firm* — Oblon, McClelland, Maier & Neustadt, L.L.P.

(57) ABSTRACT

An inductor built-in substrate includes a core substrate having openings and first through holes formed therein, a magnetic resin filling the openings and having second through holes formed therein, first through-hole conductors formed in the first through holes of the core substrate and including metal films formed in the first through holes of the core substrate, respectively, and second through-hole conductors formed in the second through holes of the magnetic resin and including metal films formed in the second through holes of the magnetic resin such that the metal films filling the second through holes of the magnetic resin, respectively.

20 Claims, 6 Drawing Sheets

(56) References Cited

U.S. PATENT DOCUMENTS

| | | | | |
|---|---|---|---|---|
| 2014/0034373 A1* | 2/2014 | Yoshikawa | ............ | H05K 1/185 |
| | | | | 336/200 |
| 2014/0145812 A1* | 5/2014 | Lee | ....................... | H01F 41/041 |
| | | | | 336/200 |
| 2014/0159851 A1* | 6/2014 | Mano | .................... | H01F 41/046 |
| | | | | 336/200 |
| 2015/0163919 A1* | 6/2015 | Nakagome | ............. | H05K 1/115 |
| | | | | 174/255 |
| 2015/0213946 A1* | 7/2015 | Mano | ....................... | H01F 17/04 |
| | | | | 336/200 |
| 2017/0125152 A1* | 5/2017 | Li | ....................... | H01F 17/0013 |
| 2017/0256497 A1* | 9/2017 | Mano | .................... | H05K 1/115 |
| 2017/0352471 A1* | 12/2017 | Mano | .................... | H01F 41/005 |
| 2018/0342342 A1* | 11/2018 | Taniguchi | ............ | H01F 17/0033 |
| 2018/0366246 A1* | 12/2018 | Park | ....................... | H01F 27/255 |
| 2019/0252316 A1* | 8/2019 | Zhang | .................. | H01F 41/042 |
| 2019/0272936 A1* | 9/2019 | Zhang | .................... | H01L 28/10 |
| 2019/0274217 A1* | 9/2019 | Zhang | ............... | H01L 23/49827 |
| 2019/0348356 A1* | 11/2019 | Hsieh | ....................... | H01F 27/40 |
| 2020/0091053 A1* | 3/2020 | Paital | ....................... | H01F 27/28 |
| 2020/0258975 A1* | 8/2020 | Shanmugam | ............ | H01L 28/10 |
| 2021/0104475 A1* | 4/2021 | Radhakrishnan | ....... | H01L 24/16 |

\* cited by examiner

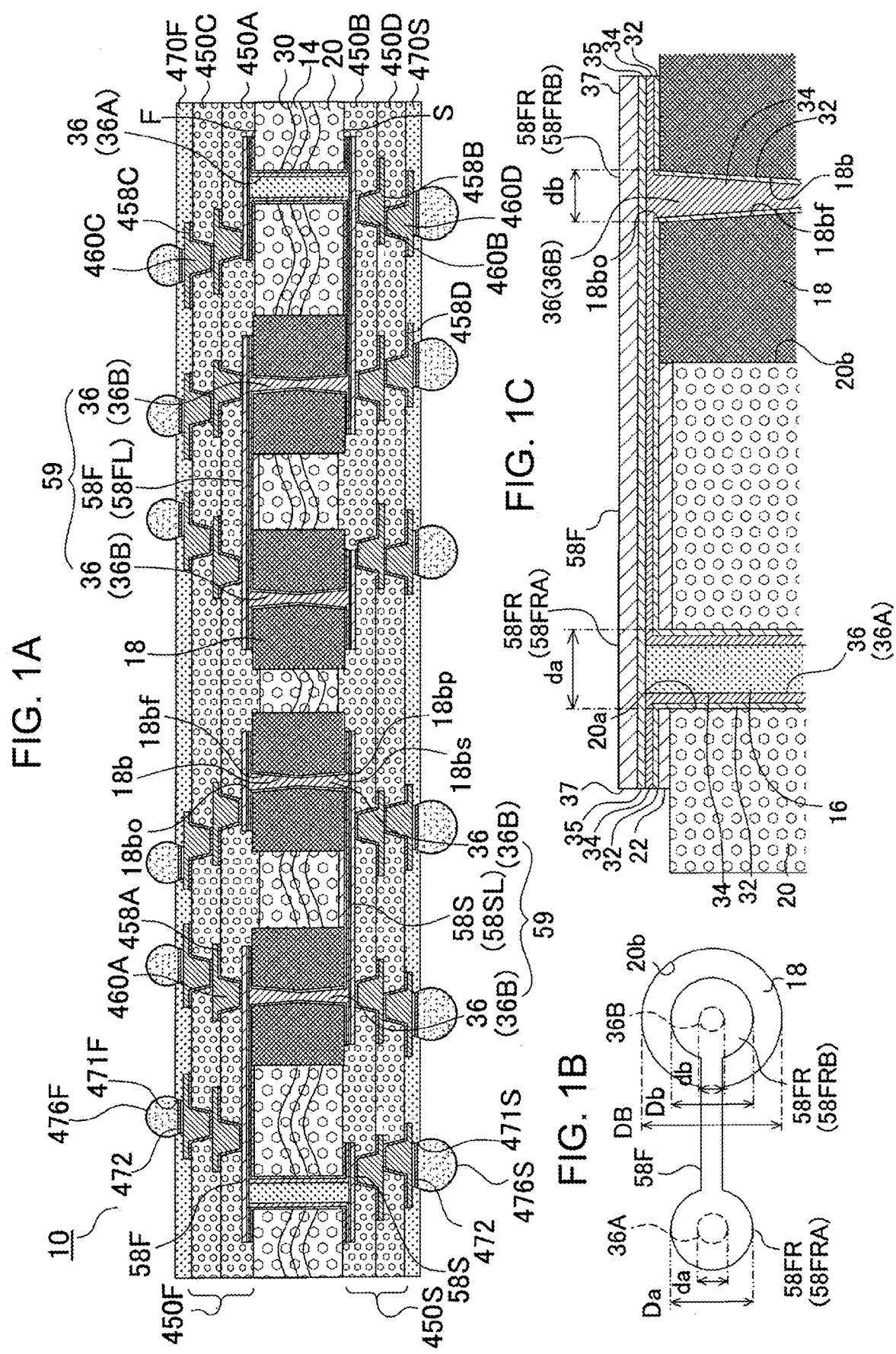

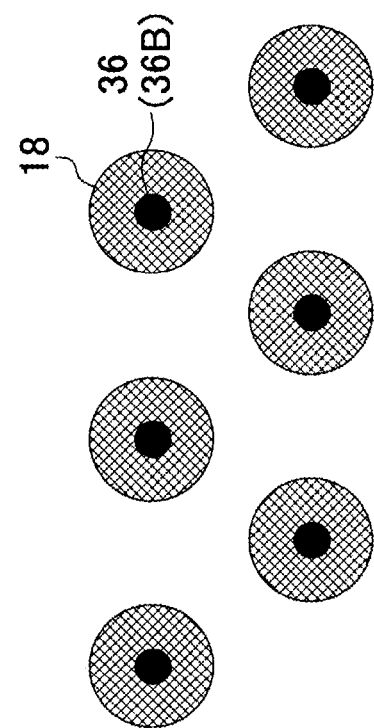

INDUCTOR BUILT-IN SUBSTRATE

CROSS-REFERENCE TO RELATED APPLICATIONS

The present application is based upon and claims the benefit of priority to Japanese Patent Application No. 2019-227175, filed Dec. 17, 2019, the entire contents of which are incorporated herein by reference.

BACKGROUND OF THE INVENTION

Field of the Invention

The present invention relates to an inductor built-in substrate that has an inductor built therein.

Description of Background Art

Japanese Patent Application Laid-Open Publication No. 2016-197624 describes a method for manufacturing an inductor component built in a wiring substrate. The entire contents of this publication are incorporated herein by reference.

SUMMARY OF THE INVENTION

According to one aspect of the present invention, an inductor built-in substrate includes a core substrate having openings and first through holes formed therein, a magnetic resin filling the openings and having second through holes formed therein, first through-hole conductors formed in the first through holes of the core substrate and including metal films formed in the first through holes of the core substrate, respectively, and second through-hole conductors formed in the second through holes of the magnetic resin and including metal films formed in the second through holes of the magnetic resin such that the metal films are filling the second through holes of the magnetic resin, respectively.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 1A is a cross-sectional view of an inductor built-in substrate according to a first embodiment of the present invention;

FIG. 1B is a plan view of through-hole lands;

FIG. 1C is an enlarged view of a core substrate of the inductor built-in substrate;

FIG. 6 is a plan view of second through-hole conductors.

DETAILED DESCRIPTION OF THE EMBODIMENTS

Figure 2A:
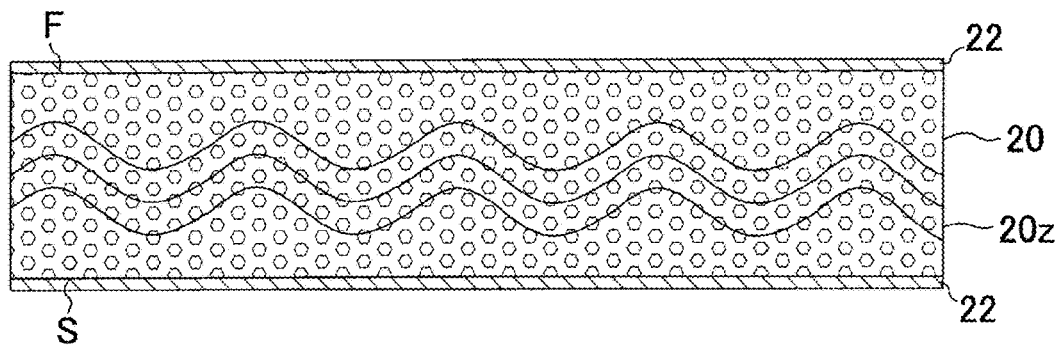
FIGS. 2A-2D are process diagrams illustrating a method for manufacturing the inductor built-in substrate of the first embodiment according to an embodiment of the present invention.

Embodiments will now be described with reference to the accompanying drawings, wherein like reference numerals designate corresponding or identical elements throughout the various drawings.

First Embodiment

FIG. 1A illustrates a cross-sectional view of an inductor built-in substrate 10 of a first embodiment that has an inductor built therein. The inductor built-in substrate 10 has a core substrate 30 that is formed to include: an insulating base material 20 that has a first surface (F) and a second surface (S) on an opposite side with respect to the first surface (F); a first conductor layer (conductor circuit) (58F) on the first surface (F) of the insulating base material; a second conductor layer (58S) on the second surface (S) of the insulating base material; and through-hole conductors 36 that connect the first conductor layer (58F) and the second conductor layer (58S) to each other. The core substrate 30 has a first surface (F) and a second surface (S) on an opposite side with respect to the first surface (F). The first surface (F) of the core substrate 30 and the first surface (F) of the insulating base material 20 are the same surface, and the second surface (S) of the core substrate 30 and the second surface (S) of the insulating base material 20 are the same surface. The insulating base material 20 is formed of a resin such as an epoxy resin and a core material 14 such as a glass cloth for reinforcement. The insulating base material 20 may further contain inorganic particles such as silica particles.

The inductor built-in substrate 10 further has an upper side build-up layer (450F) formed on the first surface (F) of the core substrate 30. The upper side build-up layer (450F) includes: an insulating layer (450A) formed on the first surface (F) of the core substrate 30; a conductor layer (458A) formed on the insulating layer (450A); and via conductors (460A) penetrating the insulating layer (450A) and connecting the first conductor layer (58F) and the conductor layer (458A) to each other. The upper side build-up layer (450F) further includes: an insulating layer (450C) formed on the insulating layer (450A) and the conductor layer (458A); a conductor layer (4580 formed on the insulating layer (450C); and via conductors (460C) penetrating the insulating layer (450C) and connecting the conductor layer (458A) and the via conductors (460A) to the conductor layer (458C).

The inductor built-in substrate 10 further has a lower side build-up layer (450S) formed on the second surface (S) of the core substrate 30. The lower side build-up layer (450S) includes: an insulating layer (450B) formed on the second surface (S) of the core substrate 30; a conductor layer (458B) formed on the insulating layer (450B); and via conductors (460B) penetrating the insulating layer (450B) and connecting the second conductor layer (58S) and the conductor layer (458B) to each other. The lower side build-up layer (450S) further includes: an insulating layer (450D) formed on the insulating layer (450B) and the conductor layer (458B); a conductor layer (458D) formed on the insulating layer (450D); and via conductors (460D) penetrating the insulating layer (450D) and connecting the conductor layer (458B) and the via conductors (460B) to the conductor layer (458D).

The inductor built-in substrate of the first embodiment further has a solder resist layer (470F) having openings (471F) formed on the upper side build-up layer (450F) and a solder resist layer (470S) having openings (471S) formed on the lower side build-up layer (450S).

Upper surfaces of the conductor layers (458C, 458D) or the via conductors (460C, 460D) exposed from the openings (471F, 471S) of the solder resist layers (470F, 470S) function as pads. A protective film 472 formed of Ni/Au, Ni/Pd/Au, Pd/Au, or OSP is formed on each of the pads. Solder bumps (476F, 476S) are respectively formed on the protective films. An IC chip (not illustrated in the drawings) is mounted on the inductor built-in substrate 10 via the solder bumps (476F) formed on the upper side build-up layer (450F). The inductor built-in substrate 10 is mounted on a motherboard (not illustrated in the drawings) via the solder bumps (476S) that are formed on the lower side build-up layer (450S).

FIG. 1C illustrates an enlarged view of a portion of the core substrate 30 in FIG. 1A. In the core substrate 30, the through-hole conductors 36 connecting the first conductor layer (58F) and the second conductor layer (58S) to each other include first through-hole conductors (36A) that are respectively formed in first through holes (20*a*) penetrating the core substrate 30 and second through-hole conductors (36B) that are respectively formed in second through holes (18*b*) of a magnetic resin 18 filled in openings (20*b*) of the core substrate 30. As illustrated in FIG. 1A, the second through holes (18*b*) each have a first tapered part (18*bf*) that is reduced in diameter from an opening (18*bo*) on the first surface (F) side of the core substrate toward the second surface (S) and a second tapered part (18*bs*) that is reduced in diameter from an opening (18*bp*) on the second surface (S) side toward the first surface (F). The first tapered part (18*bf*) and the second tapered part (18*bs*) are connected to each other by a smallest diameter part in each of the second through holes (18*b*). A diameter (db) of the opening (18*bo*) on the first surface (F) side and a diameter (db) of the opening (18*bp*) on the second surface (S) side are equal to each other. The diameter (db) of the opening (18*bo*) and the diameter (db) of the opening (18*bp*) are a maximum diameter of each of the second through holes (18*b*). A diameter (da) of each of the first through holes (20*a*) is larger than a maximum diameter (db) of each of the second through holes (18*b*). The second through-hole conductors (36B), which are each formed by filling a first electrolytic plating film 34 in the first tapered part (18*bf*) and in the second tapered part (18*bs*), each have an hourglass shape formed by butting truncated conical shapes. A resin filler 16 is filled in the cylindrical first through-hole conductors (36A) formed in the cylindrical first through holes (20*a*), and through-hole lands (58FR) are formed of cover plating. The through-hole lands (58FR) include first through-hole lands (58FRA) respectively formed on the first through-hole conductors (36A) and second through-hole lands (58FRB) respectively formed on the second through-hole conductors (36B).

FIG. 1B is a plan view of a first through-hole land (58FRA) formed on a first through-hole conductor (36A) and a second through-hole land (58FRB) formed on a second through-hole conductor (36B). The first through-hole land (58FRA) is concentrically formed with the first through-hole conductor (36A), and the second through-hole land (58FRB) is concentrically formed with the second through-hole conductor (36B). A diameter (Da) of the first through-hole land (58FRA) and a diameter (Db) of the second through-hole land (58FRB) are substantially equal to each other. The first through-hole land (58FRA) and the second through-hole land (58FRB) are connected to each other by the first conductor layer (circuit pattern) (58F). The diameter (Db) of the second through-hole land (58FRB) is smaller than a diameter (DB) of each of the openings (20*b*) in which the magnetic resin 18 is filled. That is, the second through-hole land (58FRB) does not spread from the magnetic resin 18 to the insulating base material 20.

The magnetic resin 18 contains an iron oxide filler (magnetic particles) and a resin such as an epoxy resin. Examples of the magnetic particles include iron oxide fillers such as iron (III) oxide particles. A content of the iron oxide filler in the magnetic resin is preferably 60-90% by weight. From a point of view that the content of the iron oxide filler can be increased and magnetic permeability and heat conductivity can be increased, particle sizes of the iron oxide filler are desirably non-uniform.

As illustrated in FIG. 1C, a first through-hole conductor (36A) formed in a first through hole (20*a*) penetrating the core substrate 30 is in contact with the first through hole (20*a*). The first through-hole conductor (36A) includes a first electroless plating film 32 on the first through hole (20*a*), and a first electrolytic plating film 34 on the first electroless plating film 32. A second through-hole conductor (36B) formed in a second through hole (18*b*) penetrating the magnetic resin 18 is in contact with the second through hole (18*b*). The second through-hole conductor (36B) includes a first electroless plating film 32 on the second through hole (18*b*), and a first electrolytic plating film 34 on the first electroless plating film 32.

The first through-hole lands (58FRA) and the first conductor layer (58F) on the insulating base material 20 are each formed of a copper foil 22 as a lowermost layer, the first electroless plating film 32 on the copper foil 22, the first electrolytic plating film 34 on the first electroless plating film 32, a second electroless plating film 35 on the first electrolytic plating film 34, and a second electrolytic plating film 37 on the second electroless plating film 35. The second through-hole lands (58FRB) and the first conductor layer (58F) on the magnetic resin 18 are each formed of the first electroless plating film 32 as a lowermost layer, the first electrolytic plating film 34 on the first electroless plating film 32, the second electroless plating film 35 on the first electrolytic plating film 34, and the second electrolytic plating film 37 on the second electroless plating film 35.

In the core substrate 30 of the first embodiment, the first conductor layer (58F) (connection pattern (58FL)) and the second conductor layer (58S) (connection pattern (58SL)) which are connected to each other via the second through-hole conductors (36B) formed in the magnetic resin 18 illustrated in FIG. 1A are formed in a helical shape (a spiral shape along an axis in a direction parallel to the front and back surfaces of the core substrate), and together with the second through-hole conductors (36B) form an inductor 59.

In the inductor built-in substrate 10 of the first embodiment, the first conductor layer (58F) and the second conductor layer (58S) are formed on the surfaces of the core substrate 30, and the second through-hole conductors (36B) connecting the first conductor layer (58F) and the second conductor layer (58S) to each other are directly formed in the second through holes (18*b*) penetrating the magnetic resin 18. Therefore, a ratio of a magnetic material in the inductor built-in substrate 10 is increased and an inductance can be increased.

In the inductor built-in substrate 10 of the first embodiment, the second through-hole conductors (36B) are formed by filling the first electrolytic plating film 34 in the second through holes (18b) each having a small diameter (maximum diameter (db)). The second through-hole conductors (36B) are reduced in diameter. Therefore, the second through-hole conductors (36B) in the magnetic resin 18 can be formed at a narrow pitch (for example, a minimum spacing between adjacent second through-hole conductors (36B) is 250 microns or more and 350 microns or less), and the inductance of the inductor built-in substrate can be increased. The second through-hole conductors (36B) are formed by filling the first electrolytic plating film 34, which is formed of copper having a high thermal conductivity, in the second through holes (18b), and thus have high heat dissipation performance, and the reliability of the inductor built-in substrate can be increased. The second through-hole conductors (36B) are formed by filling the first electrolytic plating film 34, which is formed of copper having a high conductivity, in the second through holes (18b), and thus have a low resistance, and a Q value of the inductor 59 can be improved.

Method for Manufacturing Inductor Built-In Substrate

A method for manufacturing the inductor built-in substrate of the first embodiment is illustrated in FIGS. 2A-4C.

Figure 2B:
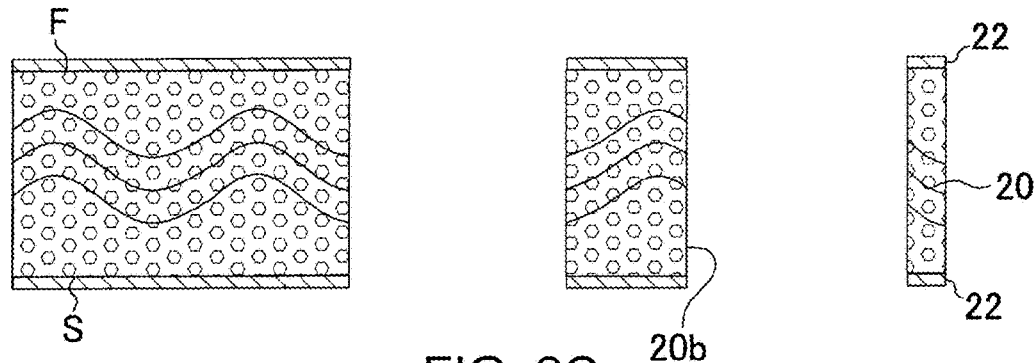
Figure 2C:
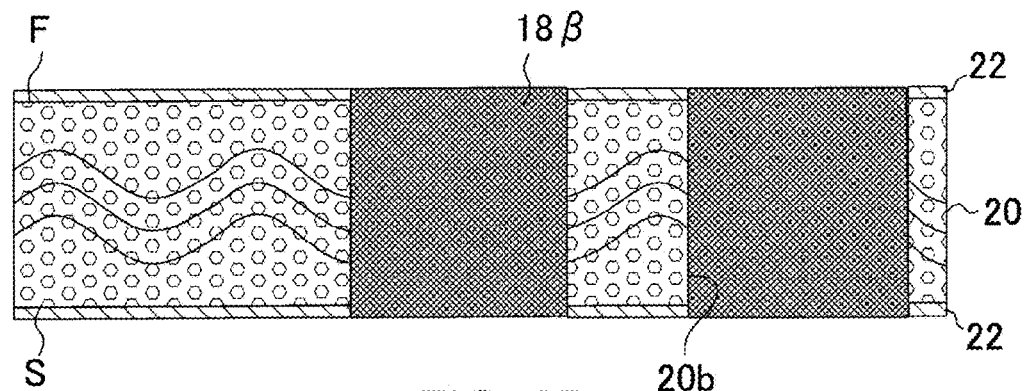

A substrate (20z) is prepared which is formed of a copper-clad laminated plate which is formed by laminating a copper foil 22 on both sides of the insulating base material 20 (FIG. 2A). The openings (20b) for filling the magnetic resin therein are formed in the insulating base material 20 (FIG. 2B). A resin paste containing an iron oxide filler (magnetic particles) in an amount of 60-90% by weight and an epoxy resin is vacuum-printed in the openings (20b). The resin paste is temporarily cured (semi-cured) at a temperature at which a viscosity of the resin paste is 2 or less times that at a normal temperature, and a temporarily cured magnetic resin (18β) is formed, and the surfaces of the insulating base material 20 are polished (FIG. 2C).

Figure 2D:
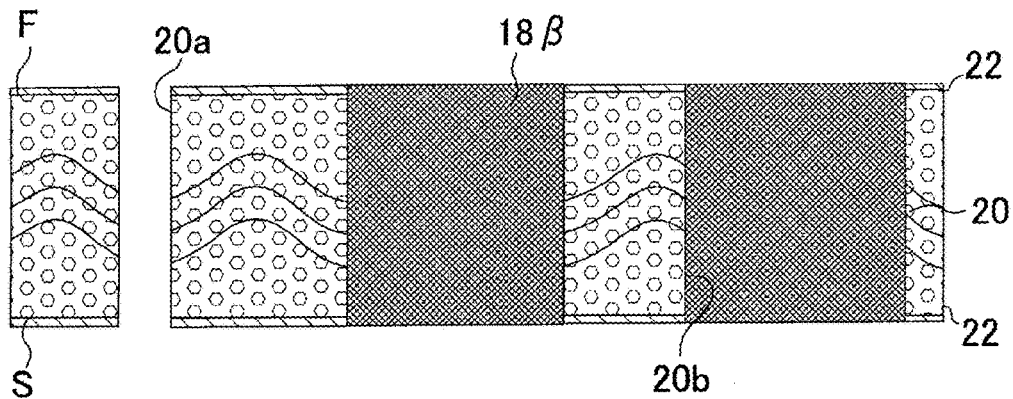
Figure 3A:
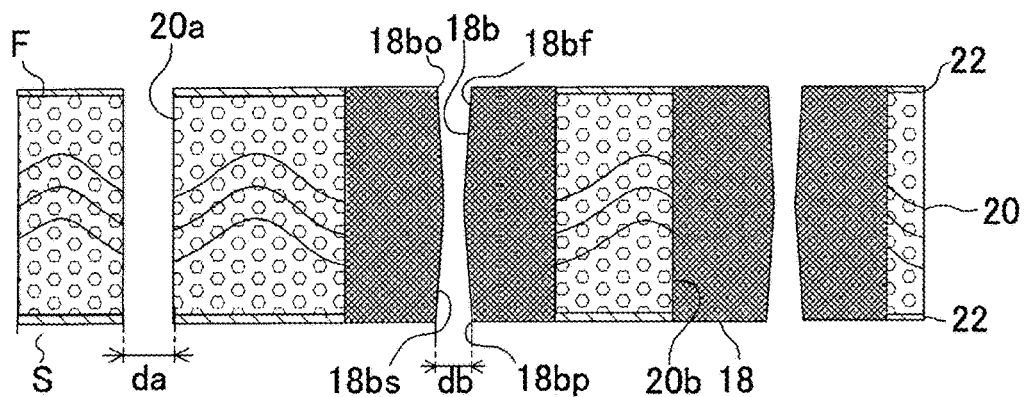
FIGS. 3A-3D are process diagrams illustrating the method for manufacturing the inductor built-in substrate according to the embodiment.
Figure 3B:
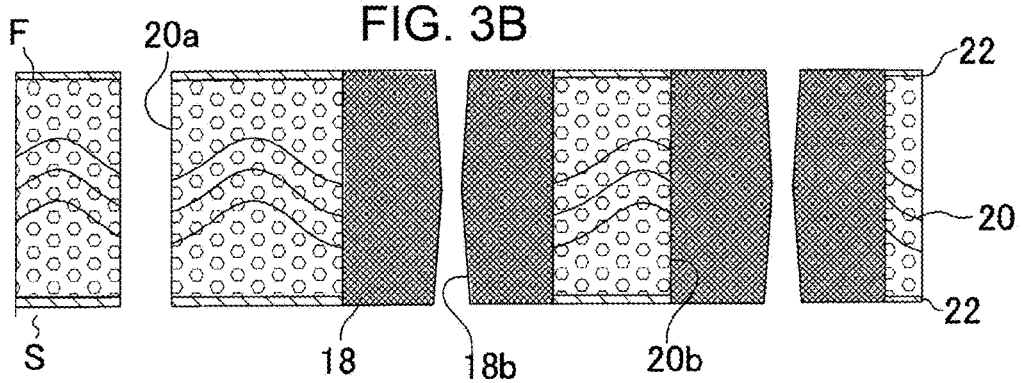

The cylindrical first through holes (20a) are formed in the insulating base material 20 by mechanical drilling (FIG. 2D). The second through holes (18b) are formed in the temporarily cured magnetic resin (18β) using laser (FIG. 3A). By irradiating laser from the first surface (F) side and the second surface (S) side, the first tapered parts (18bf) that are reduced in diameter from the openings (18bo) on the first surface (F) side of the core substrate toward the second surface (S) and the second tapered parts (18bs) that are reduced in diameter from the openings (18bp) on the second surface (S) side toward the first surface (F) are formed. In this first embodiment, since the resin paste contains the iron oxide filler in an amount of 60-90% by weight, through hole formation after fully curing is not easy. However, since the through holes are formed before fully curing, the through holes can be easily formed. The temporarily cured magnetic resin in a temporarily cured state is heated to cause the resin contained therein to crosslink, and thereby, the magnetic resin s fully cured to form the magnetic resin 18 (FIG. 3B). Here, the heating is performed at 150° C.-190° C. for 1 hour. Smears (residues) during drilling in the first through holes (20a) and in the second through holes (18b) are removed by high-pressure water washing. When desmear is performed using an acidic agent, there is a risk that the acidic agent may cause the iron oxide filler particles contained in the magnetic resin 18 to fall off in a process of swelling and peeling off the resin, and thus, high-pressure water washing is performed here. After that, the processing smears in the first through holes (20a) and the second through holes (18b) are further removed by a dry desmear treatment using O2 plasma or the like. Here, the processed smears are removed by high-pressure water washing and a dry desmear treatment. However, it is also possible to remove the smears in the first through holes (20a) and the second through holes (18b) using, for example, an alkaline chemical solution or the like that does not alter the nature of the iron oxide filler.

Further, it is also possible to perform formation and perform desmear using an acidic agent for the first through holes (20a), and then perform formation and perform desmear by high-pressure water washing or the like without using an acidic agent for the second through holes (18b).

In the manufacturing method of the first embodiment, the smear removal treatment in the first through holes (20a) of the insulating base material 20 and the second through holes (18b) of the magnetic resin 18 is performed at the same time. Therefore, it is not necessary to provide a shield layer for protecting the magnetic resin, and the inductor built-in substrate can be easily manufactured.

Figure 3C:
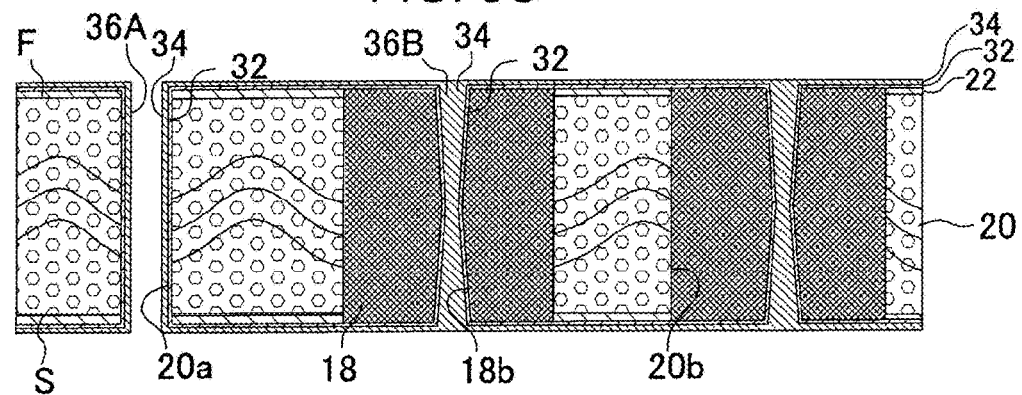

On the surfaces of the insulating base material 20 and the magnetic resin 18 and on the surfaces of the first through holes (20a) and the second through holes (18b), the first electroless plating film 32 is formed by an electroless plating treatment, and the first electrolytic plating film 34 is formed by an electrolytic plating treatment. By the first electroless plating film 32 and the first electrolytic plating film 34, the first through-hole conductors (36A) are formed in the first through holes (20a) and the second through-hole conductors (36B) are formed in the second through holes (18b) (FIG. 3C).

Figure 3D:
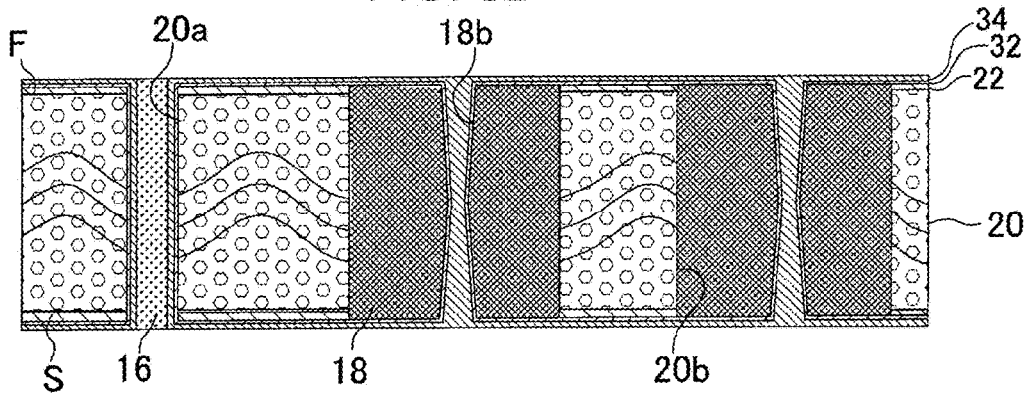
Figure 4A:
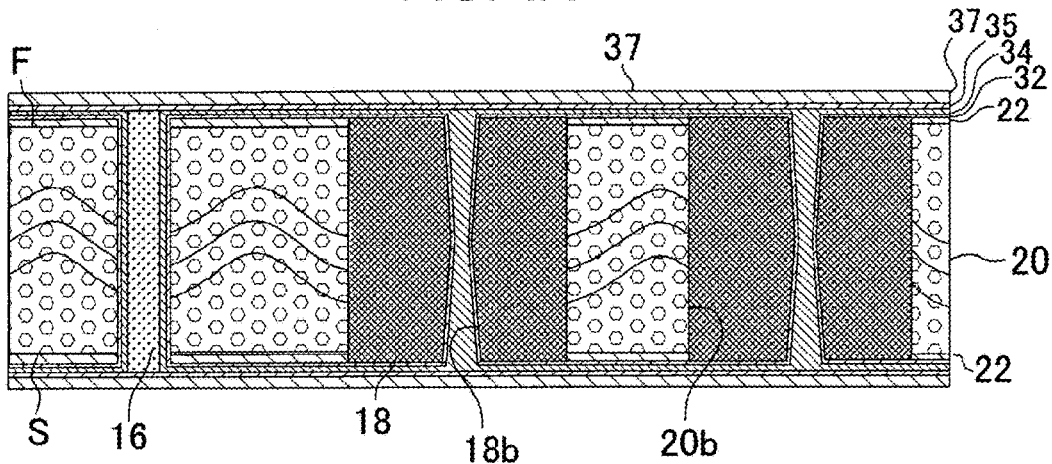
FIGS. 4A-4C are process diagrams illustrating the method for manufacturing an inductor built-in substrate according to the embodiment.
Figure 4B:
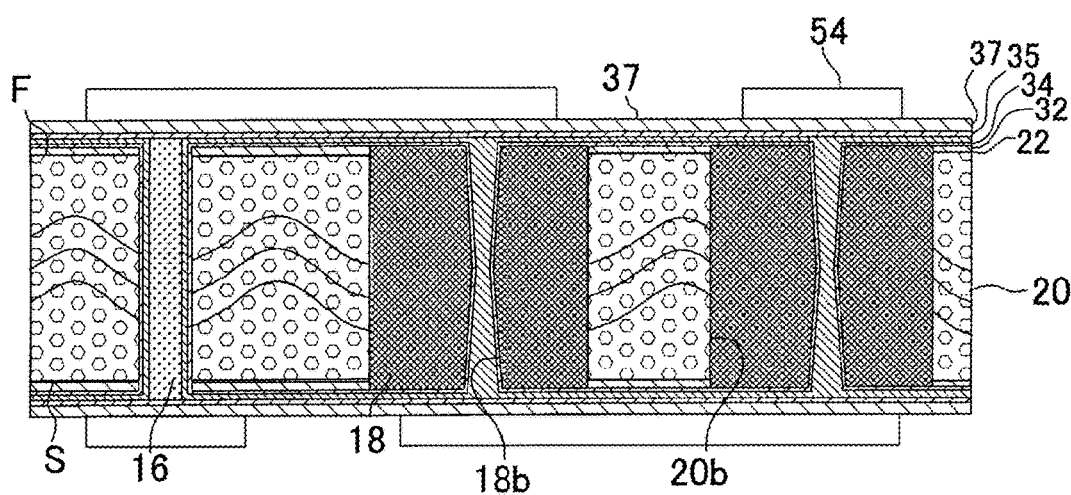

The resin filler 16 is filled in the first through-hole conductors (36A) formed in the first through holes (20a), and the surfaces of the insulating base material 20 are polished (FIG. 3D). The second electroless plating film 35 is formed on the first electrolytic plating film 34 and on the exposed surface of the resin filler 16 by electroless plating, and the second electrolytic plating film 37 is formed on the second electroless plating film 35 (FIG. 4A). An etching resist 54 of a predetermined pattern is formed on the second electrolytic plating film 37 (FIG. 4B).

Figure 4C:
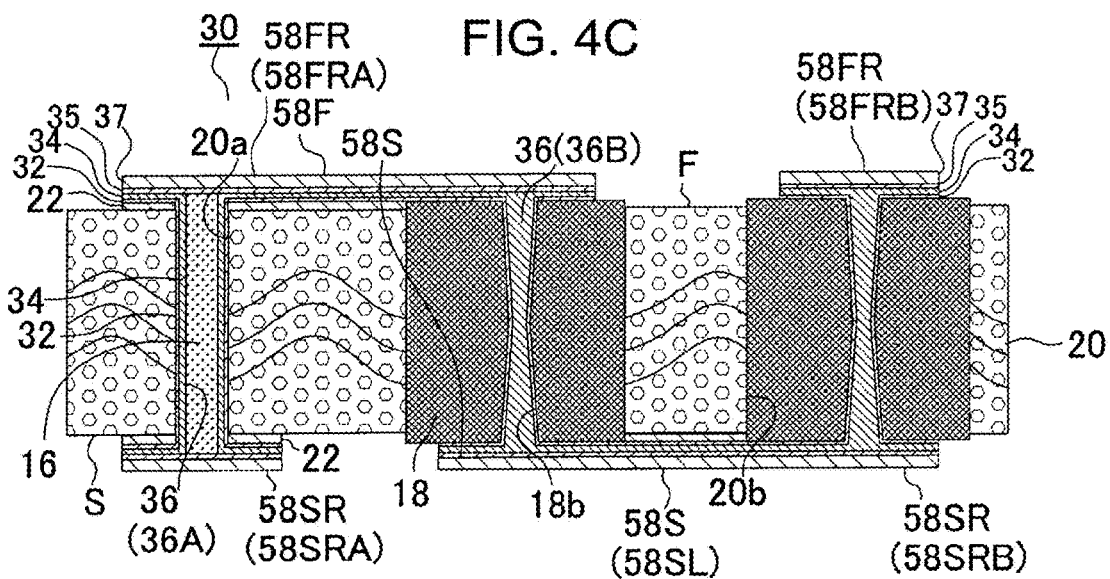

The second electrolytic plating film 37, the second electroless plating film 35, the first electrolytic plating film 34, the first electroless plating film 32, and the copper foil 22 exposed from the etching resist 54 are removed, and after that, the etching resist is removed, and the first conductor layer (58F) and the second conductor layer (58S) are formed and the core substrate 30 is completed (FIG. 4C). The first conductor layer (58F) and the second conductor layer (58S) on the insulating base material 20, and the first through-hole lands (58FRA) on the first surface (F) side and the first through-hole lands (58SRA) on the second surface (S) side of the first through-hole conductors (36A) are each formed of the copper foil 22 as a lowermost layer, the first electroless plating film 32 on the copper foil 22, the first electrolytic plating film 34 on the first electroless plating film 32, the second electroless plating film 35 on the first electrolytic plating film 34, and the second electrolytic plating film 37 on the second electroless plating film 35. The first conductor layer (58F) and the second conductor layer (58S) on the magnetic resin 18, and the second through-hole lands (58FRB) on the first surface (F) side and the second through-hole lands (58SRB) on the second surface (S) side of the second through-hole conductors (36B) are each formed of the first electroless plating film 32, the first electrolytic plating film 34 on the first electroless plating film 32, the second electroless plating film 35 on the first electrolytic plating film 34, and the second electrolytic plating film 37 on the second electroless plating film 35.

The upper side build-up layer (450F), the lower side build-up layer (450S), the solder resist layers (470F, 470S), and the solder bumps (476F, 476S) may be formed on the core substrate 30 using known manufacturing methods (FIG. 1A).

In the method for manufacturing the inductor built-in substrate of the first embodiment, the second through-hole conductors (36B) formed of the first electroless plating film 32 and the first electrolytic plating film 34 are formed in the second through holes (18b) of the magnetic resin 18. Therefore, the volume of the magnetic resin 18 of the inductor built-in substrate 10 can be increased, and the inductance can be increased. In the method for manufacturing the inductor built-in substrate of the first embodiment, the smear removal treatment in the first through holes (20a) of the insulating base material 20 and the second through holes (18b) of the magnetic resin 18 is performed at the same time. Therefore, it is not necessary to provide a shield layer for protecting the magnetic resin, and the inductor built-in substrate can be easily manufactured.

Second Embodiment

Figure 5:
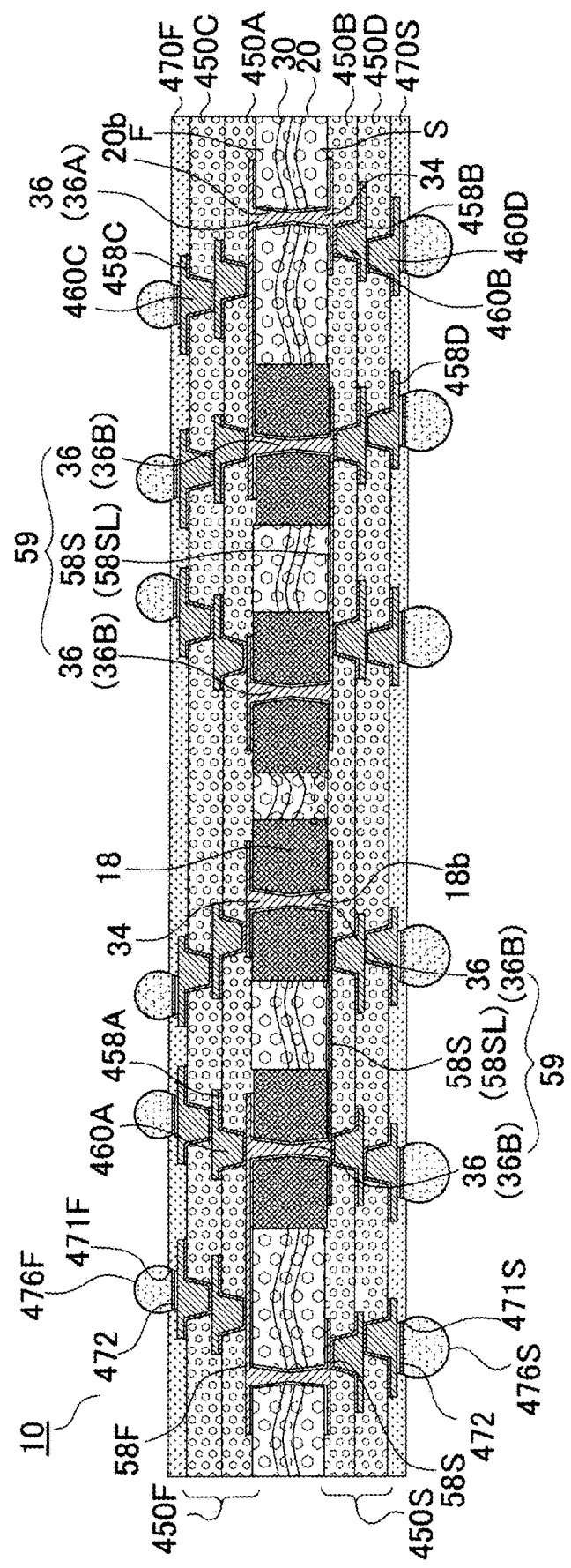
FIG. 5 is a cross-sectional view of an inductor built-in substrate according to a second embodiment of the present invention.

FIG. 5 is a cross-sectional view of an inductor built-in substrate of a second embodiment.

In the inductor built-in substrate 10 of the second embodiment, the first through-hole conductors (36A) are formed by filling a first electrolytic plating film 34 in first through holes (20b), and the second through-hole conductors (36B) are formed by filling a first electrolytic plating film 34 in the second through holes (18b). In the second embodiment, since all the through-hole conductors are formed by filling with plating, the heat conductivity is high and the reliability is high.

FIG. 6 is a plan view of the second through-hole conductors.

In the inductor built-in substrate of the first embodiment and the inductor built-in substrate of the second embodiment, the second through-hole conductors (36B) are formed in a staggered pattern. Therefore, the second through-hole conductors (36B) can be formed at a narrow pitch, and the inductance of the inductor built-in substrate can be increased.

In Japanese Patent Application Laid-Open Publication No. 2016-197624, a magnetic material is accommodated inside a resin layer, through-hole conductors are provided in the resin layer, and the through-hole conductors are prevented from being in contact with the magnetic material.

In Japanese Patent Application Laid-Open Publication No. 2016-197624, since the through-hole conductors are formed in the resin layer, it is thought that a ratio of the magnetic material with respect to a size of the inductor component is low and it is difficult to increase an inductance.

An inductor built-in substrate according to an embodiment of the present invention is small in size and has a large inductance.

An inductor built-in substrate according to an embodiment of the present invention includes: a core substrate in which openings and first through holes are formed; a magnetic resin that is filled in the openings and has second through holes; first through-hole conductors that are respectively formed of metal films formed in the first through holes; and second through-hole conductors that are respectively formed of metal films formed in the second through holes. The second through-hole conductors are respectively formed by filling the metal films in the second through holes.

In an inductor built-in substrate according to an embodiment of the present invention, the second through-hole conductors formed of the metal films are respectively directly formed in the second through holes of the magnetic resin. Therefore, a volume of the magnetic resin of an inductor component can be increased, and an inductance can be increased. The second through-hole conductors are formed by filling the metal films and are reduced in diameter. Therefore, the second through-hole conductors in the magnetic resin can be formed at a narrow pitch, and the inductance can be increased.

Obviously, numerous modifications and variations of the present invention are possible in light of the above teachings. It is therefore to be understood that within the scope of the appended claims, the invention may be practiced otherwise than as specifically described herein.

What is claimed is:

1. An inductor built-in substrate, comprising:
   a core substrate having a plurality of openings and a plurality of first through holes formed therein;
   a magnetic resin filling the plurality of openings and having a plurality of second through holes formed therein such that a maximum diameter of each of the second through holes is smaller than a maximum diameter of each of the first through holes of the core substrate;
   a plurality of first through-hole conductors formed in the plurality of first through holes of the core substrate and comprising a plurality of metal films formed in the plurality of first through holes of the core substrate, respectively; and
   a plurality of second through-hole conductors formed in the plurality of second through holes of the magnetic resin and comprising a plurality of metal films comprising metal plating such that the metal plating of the plurality of metal films is formed in the plurality of second through holes of the magnetic resin and that the second through holes of the magnetic resin are filled with the metal plating of the plurality of metal films, respectively.

2. The inductor built-in substrate according to claim 1, wherein the magnetic resin is formed such that each of the second through holes has a first opening on a first surface of the core substrate, a second opening on a second surface of the core substrate on an opposite side with respect to the first surface, a first tapered portion reducing in diameter from the first opening toward the second surface of the core substrate, and a second tapered portion reducing in diameter from the second opening toward the first surface of the core substrate.

3. The inductor built-in substrate according to claim 2, wherein the plurality of first through-hole conductors is formed such that each of the first through-hole conductors has a cylindrical shape and a resin material filling an inner space of the cylindrical shape.

4. The inductor built-in substrate according to claim 2, wherein the magnetic resin is formed such that the plurality of second through holes is formed in a staggered pattern.

5. The inductor built-in substrate according to claim 2, wherein the plurality of second through-hole conductors is formed such that a minimum spacing between the second through-hole conductors is in a range of 250 microns to 350 microns.

6. The inductor built-in substrate according to claim 2, wherein the core substrate is formed such that a diameter of each of the openings is greater than the maximum diameter of each of the first through holes of the core substrate.

7. The inductor built-in substrate according to claim 1, wherein the plurality of first through-hole conductors is formed such that each of the first through-hole conductors has a cylindrical shape and a resin material filling an inner space of the cylindrical shape.

8. The inductor built-in substrate according to claim 7, wherein the magnetic resin is formed such that the plurality of second through holes is formed in a staggered pattern.

9. The inductor built-in substrate according to claim 7, wherein the plurality of second through-hole conductors is formed such that a minimum spacing between the second through-hole conductors is in a range of 250 microns to 350 microns.

10. The inductor built-in substrate according to claim 1, wherein the core substrate is formed such that a diameter of each of the openings is greater than the maximum diameter of each of the first through holes of the core substrate.

11. The inductor built-in substrate according to claim 10, wherein the magnetic resin is formed such that the plurality of second through holes is formed in a staggered pattern.

12. The inductor built-in substrate according to claim 10, wherein the plurality of second through-hole conductors is formed such that a minimum spacing between the second through-hole conductors is in a range of 250 microns to 350 microns.

13. The inductor built-in substrate according to claim 1, wherein the magnetic resin is formed such that the plurality of second through holes is formed in a staggered pattern.

14. The inductor built-in substrate according to claim 13, wherein the plurality of second through-hole conductors is formed such that a minimum spacing between the second through-hole conductors is in a range of 250 microns to 350 microns.

15. The inductor built-in substrate according to claim 1, wherein the plurality of second through-hole conductors is formed such that a minimum spacing between the second through-hole conductors is in a range of 250 microns to 350 microns.

16. The inductor built-in substrate according to claim 1, wherein each of the second through-hole conductors has a through hole-land formed such that a diameter of the through-hole land of each of the second through-hole conductors is smaller than a diameter of each of the openings of the core substrate.

17. The inductor built-in substrate according to claim 1, further comprising:
a first conductor layer formed on a first surface of the core substrate;
a second conductor layer formed on a second surface of the core substrate on an opposite side with respect to the first surface,
wherein the plurality of first through-hole conductors is formed such that the plurality of first through-hole conductors is connecting the first conductor layer and the second conductor layer.

18. The inductor built-in substrate according to claim 1, wherein the plurality of first through-hole conductors is formed such that the plurality of metal films of the first through-hole conductors is filling the plurality of first through holes of the core substrate, respectively.

19. The inductor built-in substrate according to claim 18, wherein the core substrate is formed such that a diameter of each of the openings is greater than the maximum diameter of each of the first through holes of the core substrate.

20. The inductor built-in substrate according to claim 18, wherein the magnetic resin is formed such that the plurality of second through holes is formed in a staggered pattern.

* * * * *